(12) United States Patent
Shyu et al.

(10) Patent No.: US 7,056,791 B2
(45) Date of Patent: Jun. 6, 2006

(54) METHOD OF FORMING AN EMBEDDED FLASH MEMORY DEVICE

(75) Inventors: Der-Shin Shyu, Hsinchu (TW); Hung-Cheng Sung, Hsinchu (TW); Chen-Ming Huang, Taoyuan (TW); Hsui Ouyang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 7 days.

(21) Appl. No.: 10/859,125

(22) Filed: Jun. 3, 2004

(65) Prior Publication Data

US 2004/0248367 A1 Dec. 9, 2004

(30) Foreign Application Priority Data

Jun. 5, 2003 (TW) ................................ 92115182 A

(51) Int. Cl.
*H01L 21/8247* (2006.01)

(52) U.S. Cl. .................. 438/258; 438/596; 438/981
(58) Field of Classification Search ............. None
See application file for complete search history.

(56) References Cited

U.S. PATENT DOCUMENTS

| 6,265,267 | B1 | 7/2001 | Huang |
| 6,429,075 | B1 | 8/2002 | Yeh et al. |
| 6,706,592 | B1 * | 3/2004 | Chern et al. ............... 438/257 |
| 6,831,325 | B1 * | 12/2004 | Lojek ....................... 257/315 |
| 2002/0142545 | A1 | 10/2002 | Lin |

\* cited by examiner

*Primary Examiner*—Chandra Chaudhari
(74) *Attorney, Agent, or Firm*—Birch, Stewart, Kolasch & Birch, LLP

(57) ABSTRACT

A method of fabricating an embedded flash memory device. A substrate having a memory area is provided. A device is formed on the substrate in the memory area. A conductive layer is formed over the substrate to cover the device in the memory area. A conformal insulating layer is formed on the conductive layer and the substrate. The insulating layer is removed at an edge of the memory area. By anisotropic etching, the insulating layer and part of the conductive layer is removed to form a control gate on the sidewall of the device. Thus, polysilicon residue caused by the conventional control gate process does not occur.

26 Claims, 14 Drawing Sheets

METHOD OF FORMING AN EMBEDDED FLASH MEMORY DEVICE

This Nonprovisional application claims priority under 35 U.S.C. § 119(a) on Patent Application No(s). 92115182 filed in TAIWAN, R.O.C. on Jun. 5, 2003, the entire contents of which are hereby incorporated by reference.

BACKGROUND OF THE INVENTION

1. Field of the Invention

The present invention relates to a method of forming an embedded flash memory device. More particularly, the invention relates to a method of removing polysilicon residue in an embedded flash memory process without additional photolithography steps.

2. Description of the Related Art

Complementary metal oxide semiconductor (CMOS) memory can be divided into two main categories, random access memory (RAM) and read-only memory (ROM). Market demand for ROM has grown steadily in recent years and further growth is expected, particularly for flash memory in which any cell can be electrically programmed and a block, sector or page of cells can be electrically erased simultaneously. Flash memory offers greater flexibility than electrically programmable read-only memory (EPROM), as it is electrically programmable but erasable via ultraviolet exposure. Electrically erasable and programmable read-only memory (EEPROM) offers the advantage of being electrically erasable and programmable to the single byte, but is cost prohibitive and typically manufactured only for specific applications. In recent years, flash memory has found interesting applications in electrical consumer products such as, digital cameras, digital video cameras, cellular phones, laptop computers and Personal Digital Assistants (PDAs). Since mobility is a high priority for electrical consumer products, product size must be minimal. As a result, the capacity and functionality of flash memory modules must increase while size is reduced. The capacity of flash memory has increased from 4 to 256 MB and will increase up to 1 GB in the future.

In order to lower manufacturing cost, simplify the manufacturing procedures and increase operational speed for a semiconductor device, integrating different devices, such as a memory cell and a logic circuit on the same wafer has become a trend in semiconductor manufacturing. An example of such is an embedded flash memory device. The embedded flash memory cell comprises a flash memory cell and a logic circuit device formed on the same wafer.

FIGS. 1A to 1J are sectional views of a portion of a semiconductor substrate, schematically illustrating a conventional fabrication process for forming an embedded flash memory.

In FIG. 1A, a semiconductor substrate 100 comprising a memory area 102 and a logic circuit area 104 is provided. An isolation structure 106, such as an STI (shallow trench isolation), is formed in the substrate 100 to isolate the memory area 102, the logic circuit area 104 and active devices.

In FIG. 1A, by a known method disclosed in U.S. Pat. No. 6,429,075 or U.S. Publication No. 2002/0142545, a precursory flash memory structure 107 is formed on the substrate 100 in the memory area 102. The structure 107 includes a source region 108 formed in the substrate 100. A floating gate 110 is formed above part of the substrate 100, wherein an insulating layer 112 is formed therebetween. An insulating spacer 114 is formed on the floating gate 110. A conductive plug 116 electrically connects the source region 108 and is insulated from the floating gate 110 by an insulating layer 118. An oxide cap layer 120 is formed over the conductive plug 116. A conformal insulating layer 122 is formed on the sidewalls of the insulating spacer 114 and the floating gate 110. The conformal insulating layer 122 also expands to cover a portion of the substrate 100.

In FIG. 1B, a polysilicon layer (not shown) is formed on the insulating layer 122 to cover the structure 107. By performing a first photolithography procedure, the polysilicon layer (not shown) and the insulating layer 122 in the logic area 104 are removed to form a first polysilicon layer 130 over the substrate 100 in the memory area 102. The first polysilicon layer 130 is insulated from the substrate 100 by means of the insulating layer 122. During etching, it is difficult in practice to keep the sidewall of the first polysilicon layer 130 perpendicular to the substrate 100, thereby causing a polysilicon residue (162, as shown in FIG. 1H) to remain in subsequent steps. For example, the angle θ between the two planes is about 85~87°.

In FIG. 1C, a first oxide layer 132 with a thickness of about 200 Å is blanketly formed overlying the substrate 100.

Referring to FIG. 1D, a process for defining an oxide layer with various thicknesses in the logic circuit area 104 is performed. In order to simplify the illustration, an oxide layer with two thicknesses is illustrated here. For example, by performing a second photolithography procedure and etching back the first oxide layer 132, a thick oxide layer 132 and a thin oxide layer 134 are formed in the logic circuit area 104. The thick oxide layer 132 can serve as the gate insulating layer for a high voltage MOS. The thin oxide layer 134 can serve as the gate insulating layer for a low voltage MOS. In FIG. 1D, a photoresist layer 136 covering the memory area 102 and part of the logic circuit area 104 serves as a mask layer in the photolithography procedure. Next, the photoresist layer 136 is stripped.

In FIG. 1E, a polysilicon layer (not shown) is conformally formed above the substrate 100. By performing a third photolithography procedure and anisotropic etching, part of the polysilicon layer (not shown) is removed to form gates 140, 140 in the logic area 104. Subsequent to this step (referred to as the MOS gate process), a first polysilicon residue 142 remains on the sidewall of the first oxide layer 132 on the first polysilicon layer 130.

In FIG. 1F, by performing a fourth photolithography procedure, a photoresist layer 150 is formed to cover the logic circuit area 104.

In FIG. 1G, the first polysilicon residue 142 is removed by isotropic etching. At this time, the first oxide layer 132 is also partially etched back to decrease the thickness thereof to about 100 Å.

In FIG. 1H, using the photoresist layer 150 as a mask, part of the first polysilicon layer 130 (including the first oxide layer 132 thereon) is removed by anisotropic etching. Thus, a control gate 160 is defined on the sidewall of the insulating spacer 114. The perpendicular thickness of the first oxide layer 132, however, is very thick and not perpendicular to the substrate 100 at the edge of the memory area 102, and causes a second polysilicon residue 162 to be left under the remaining oxide layer 132. Next, the photoresist layer 150 is removed.

In FIG. 1I, by performing a fifth photolithography procedure, a photoresist layer 170 is formed covering the memory area 102 and the logic area 104, but the second polysilicon residue 162 and the remaining oxide layer 132 above the isolation structure 106 are exposed.

Using the photoresist layer 170 as a mask, the unwanted second polysilicon residue 162 and the unwanted remaining oxide layer 132 are removed by isotropic etching. The photoresist layer 170 is then stripped, as shown as FIG. 1J.

In Fig. 1J, the insulating layer 122 adjacent to the control gate 160 is removed. Doped regions 172 and 174 are then formed in part of the substrate 100. Thus, a flash memory cell in the memory area 102 and MOS structures in logic area 104 are obtained. The doped region 172 serves as a drain region of the flash memory cell. The doped region 174 serves as a source/drain region of MOS.

According to the conventional method, an additional photolithography step is required to remove the second polysilicon residue 162 and the remaining oxide layer 132 above the isolation structure 106, thereby increasing manufacturing cost.

U.S. Pat. No. 6,429,075 discloses a process for forming a flash memory cell having a self-aligning floating gate. The method uses anisotropic etching to form a control gate beside an insulating spacer. Nevertheless, the method does not teach how to remove the polysilicon residue generated by the embedded flash memory process.

U.S. Patent Publication No. 2002/0142545 discloses a process for forming a self-aligned split gate flash memory cell. The method prevents short circuit or open circuits caused by misalignment during photolithography. Nevertheless, the method does not illustrate how to remove the polysilicon residue generated by the embedded flash memory process.

U.S. Pat. No. 6,265,267 discloses a fabrication method for an embedded flash memory device with various thicknesses of the gate oxide layers. The method prevents the gate oxide layer from damage during the removal of the photoresist, and forms the gate oxide layers with various thicknesses to accommodate demand for high and low voltage device operation. Nevertheless, the method does not teach how to remove the polysilicon residue generated by the embedded flash memory process.

SUMMARY OF THE INVENTION

The object of the present invention is to provide a method of fabricating an embedded flash memory device.

Another object of the present invention is to provide an improved method of removing polysilicon residue in an embedded flash memory process.

In order to achieve these objects, the present invention provides a method of fabricating an embedded flash memory device. A substrate having a memory area and a logic circuit area is provided. A first device is formed on the substrate in the memory area. A conductive layer is formed over the substrate to cover the first device in the memory area. A conformal first insulating layer is formed on the conductive layer and the substrate. The first insulating layer at an edge of the memory area is partially etched back to form a second insulating layer therein, wherein the thickness of the second insulating layer is less than that of the first insulating layer. A semiconductor process is performed to form a second device on the substrate in the logic circuit area, and simultaneously leave a polysilicon residue overlying a sidewall of the conductive layer. A mask layer is formed over the substrate to cover the second device in the logic circuit area. The polysilicon residue and the second insulating layer are removed to expose the surface of the conductive layer at the edge of the memory area. The first insulating layer and part of the conductive layer are anisotropically etched to form a control gate on the sidewall of the first device.

The present invention improves on the related art in that the first insulating layer at an edge of the memory area is partially etched back to form a second insulating layer therein, wherein the thickness of the second insulating layer is less than that of the first insulating layer. The polysilicon residue and the second insulating layer are removed to expose the surface of the conductive layer at the edge of the memory area. Thus, polysilicon residue generated by the conventional control gate process does not occur, thereby simplifying the conventional process, reducing manufacturing cost and ameliorating disadvantages of the related art.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

DETAILED DESCRIPTION OF THE INVENTION

FIGS. 2~10 schematically illustrate a fabrication process for forming an embedded flash memory device of the present invention.

Figure 2:
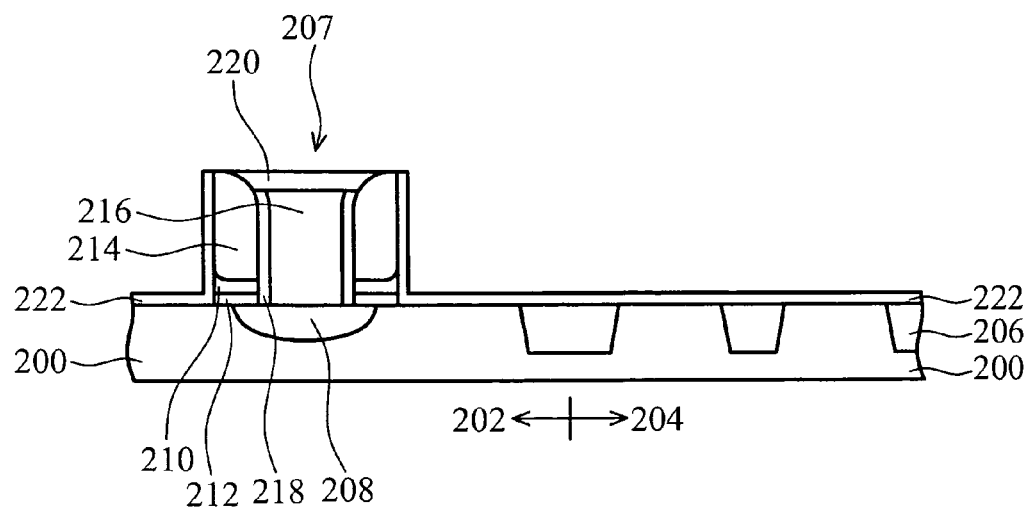
FIGS. 2~10 are sectional views of a portion of a semiconductor substrate, schematically illustrating a fabrication process for forming an embedded flash memory device, according to the present invention.

In FIG. 2, a semiconductor substrate 200 comprising a memory area 202 and a logic circuit area (or a peripheral circuit area) 204 is provided. The semiconductor substrate can be a silicon substrate. An isolation structure 206, such as an STI (shallow trench isolation) or a FOX (field oxide) structure, is formed in/on the substrate 200 to isolate the memory area 202, the logic area 204 and active devices (not shown).

In FIG. 2, by a known method disclosed in U.S. Pat. No. 6,429,075 or U.S. Publication No. 2002/0142545, a precursory flash memory structure 207 is formed on the substrate 200 in the memory area 202. The structure 207 includes a source region 208 formed in the substrate 200. A floating gate 210 is formed above part of the substrate 200, wherein an insulating layer 212 is formed therebetween. An insulating spacer 214 is formed on the floating gate 210. A conductive plug 216 electrically connects the source region 208 and is insulated from the floating gate 210 by an insulating layer 218. An oxide cap layer 220 is formed over the conductive plug 216. A conformal insulating layer 222 (also referred to as an intergate/interpoly dielectric layer) is formed on the sidewalls of the insulating spacer 214 and the floating gate 210 and expands to cover a potion of the substrate 200.

An example for illustrating the manufacturing process of the above structure 207 is provided, but is not intended to limit the present invention. FIGS. 11A~11G are sectional views showing the formation of the precursory flash memory structure 107 used in this embodiment.

Figure 11A:
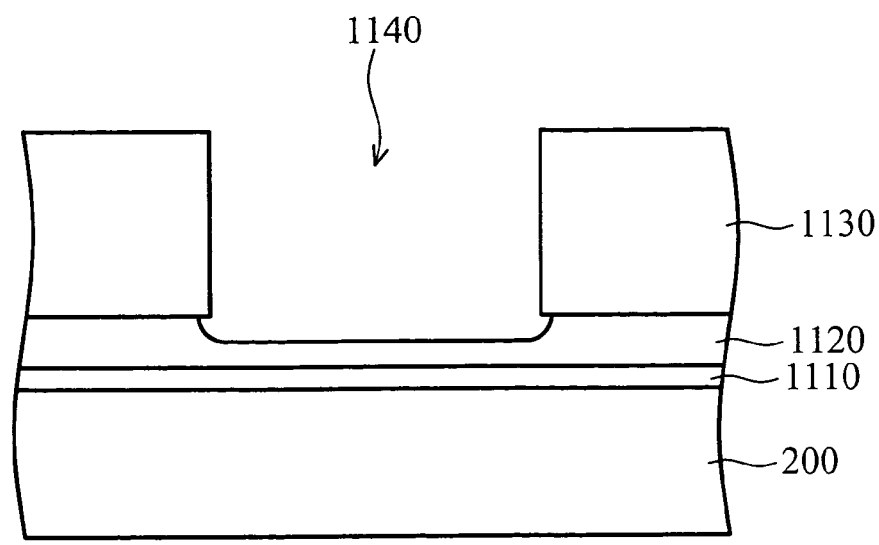
FIGS. 11A~11G are sectional views illustrating the formation of a precursory flash memory structure used in an embodiment of the present invention.

In FIG. 11A, a first insulating layer 1110 and a conductive layer 1120 are sequentially formed on the substrate 200. The first insulating layer 1110 can be a $SiO_2$ layer and the conductive layer 1120 can be a doped polysilicon layer. A buffer layer 1130 is formed on part of the conductive layer 1120, wherein the buffer layer has a first opening 1140 exposing the conductive layer 1120. The buffer layer 1130 can be a SiN or SiON layer.

Figure 11B:
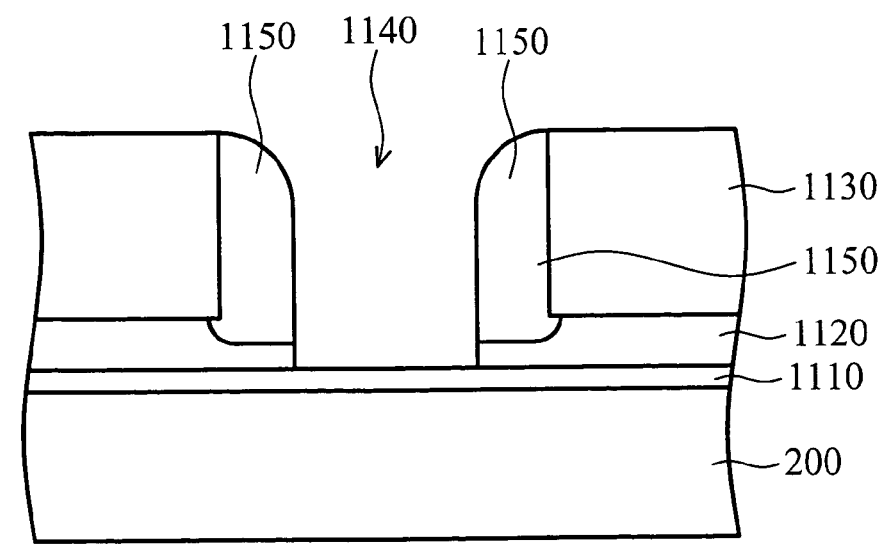

In FIG. 11B, an insulating spacer 1150 is formed on the sidewall of the first opening 1140 to cover part of the conductive layer 1120. The insulating spacer 1150 can be a TEOS-$SiO_2$ layer.

Figure 11C:
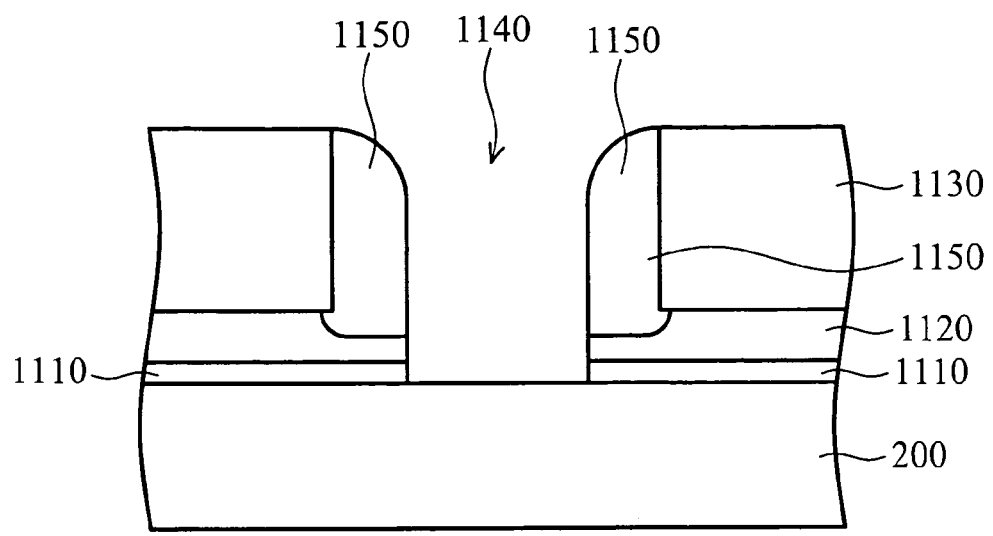

In FIGS. 11B and 11C, using the insulating spacer 1150 as a mask, the conductive layer 1120 and the first insulating layer 1110 beneath the first opening 1140 are sequentially removed to expose the substrate 200.

Figure 11D:
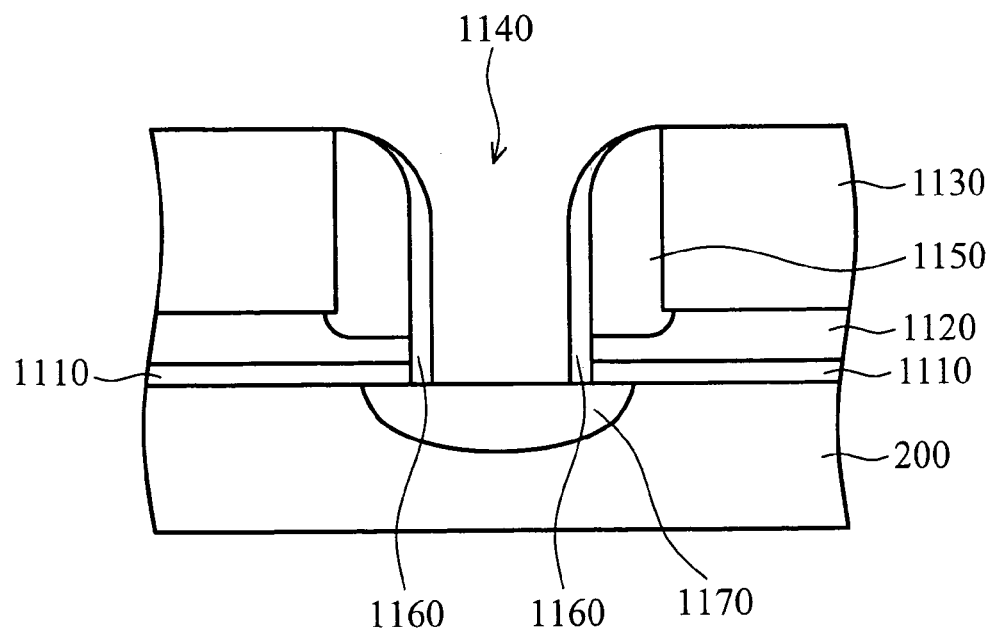

In FIG. 11D, a dielectric layer 1160 is formed on the sidewall of the first opening 1140. The dielectric layer 1160 can be an ONO (oxide/nitride/oxide) layer. A first doped region 1170 is then formed in the substrate 200 in the first opening 1140.

Figure 11E:
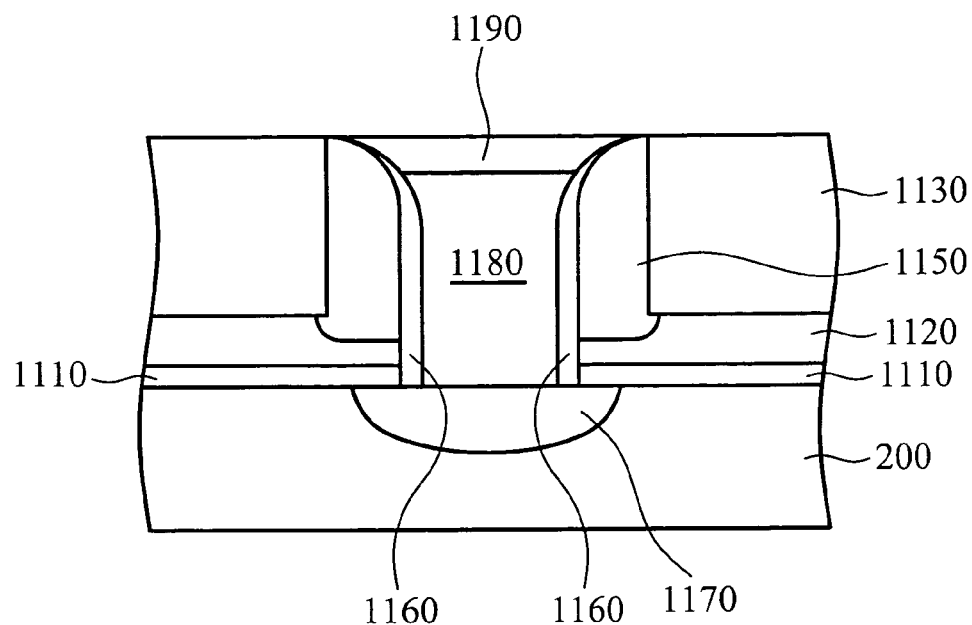

In FIG. 11E, a conductive plug 1180 is formed in the first opening 1140 to electrically connect the first doped region 1170. The conductive plug 1180 can be a polysilicon plug. The top surface of the conductive plug 1180 is then oxidized to form an oxide cap layer 1190 thereon. The oxide cap layer 1190 can be a polysilicon oxide layer.

Figure 11F:
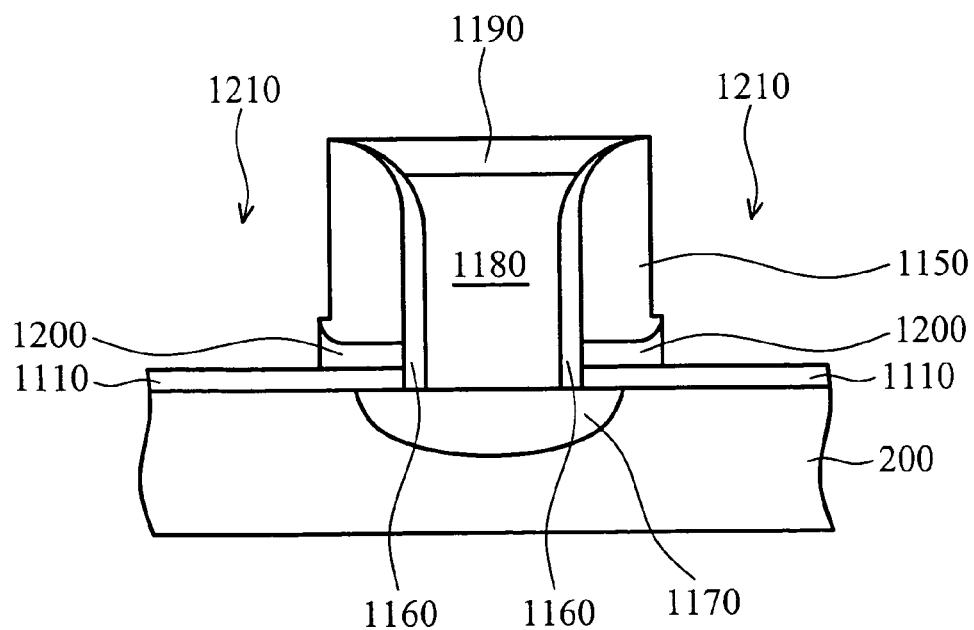

In FIG. 11F, using the oxide cap layer 1190 and the insulating spacer 1150 as masks, the buffer layer 1130 and part of the conductive layer 1120 are removed to define a floating gate 1200 and a second opening 1210.

Figure 11G:
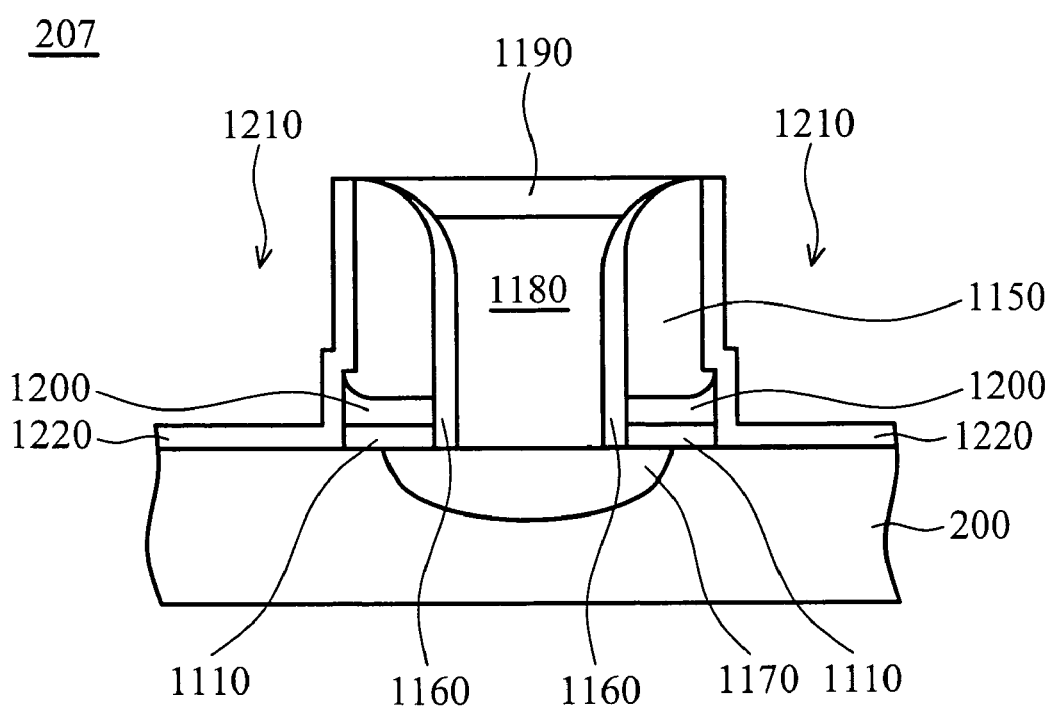

In FIG. 11G, a conformal second insulating layer 1220 is formed on the surface of the second opening 1210. The second insulating layer 1220 can be a $SiO_2$ layer. In order to simplify the illustration and the drawings, the insulating layers 1110 and 1220 in the second opening 1210 are to be generally called the second insulating layer 1220. The precursory flash memory structure 207 is thus obtained.

Comparing FIG. 11G with FIG. 2, the doped region 1170 corresponds to the source region 208. Symbol 1200 corresponds to the floating gate 210. The first insulating layer 1110 corresponds to the insulating layer 212. The symbol 1150 corresponds to the insulating spacer 214. The symbol 1180 corresponds to the conductive plug 216. The dielectric layer 1160 corresponds to the insulating layer 218. The polysilicon oxide layer 1190 corresponds to the oxide cap layer 220. The second insulating layer 1220 corresponds to the insulating layer 222.

Figure 3:
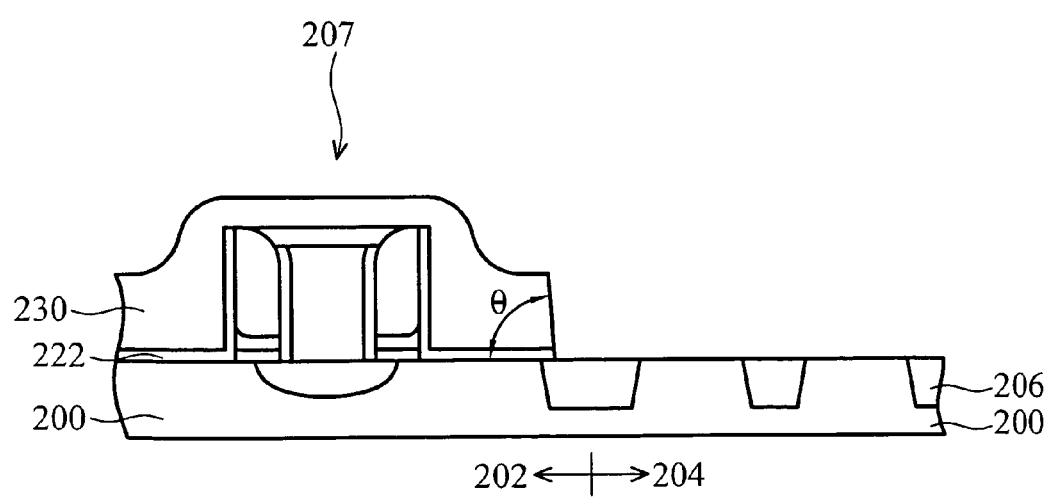

Next, referring to FIG. 3, a conformal doped polysilicon layer (not shown) is formed on the insulating layer 222 to cover the structure 207. By performing photolithography, a first photoresist layer (not shown) is formed over the memory area 202. Using the first photoresist layer (not shown) as a mask, the doped polysilicon layer (not shown) and the insulating layer 222 in the logic circuit area 204 are removed to form a first polysilicon layer 230 in the memory area 202. The first polysilicon layer 230 is insulated from the substrate 200 by the insulating layer 222. The first photoresist layer (not shown) is then stripped. During etching, it is difficult in practice to keep the sidewall of the first polysilicon layer 230 perpendicular to the substrate 200. For example, the angle θ between the two planes is about 85~87°.

Figure 4:
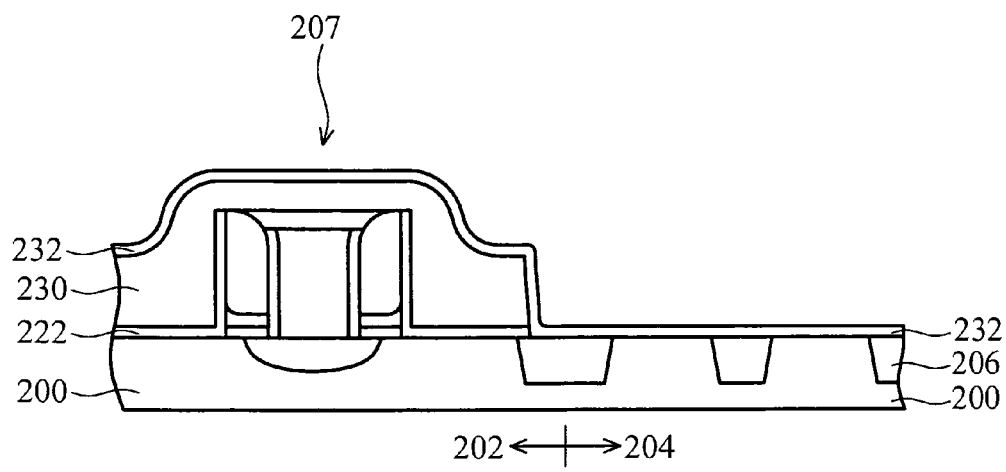

In FIG. 4, a conformal third insulating layer 232 with a thickness of about 200 Å is blanketly formed overlying the substrate 200. The third insulating layer 232 can be a $SiO_2$ layer formed by CVD (chemical vapor deposition) and its thickness is greater than 190 Å.

Figure 5:
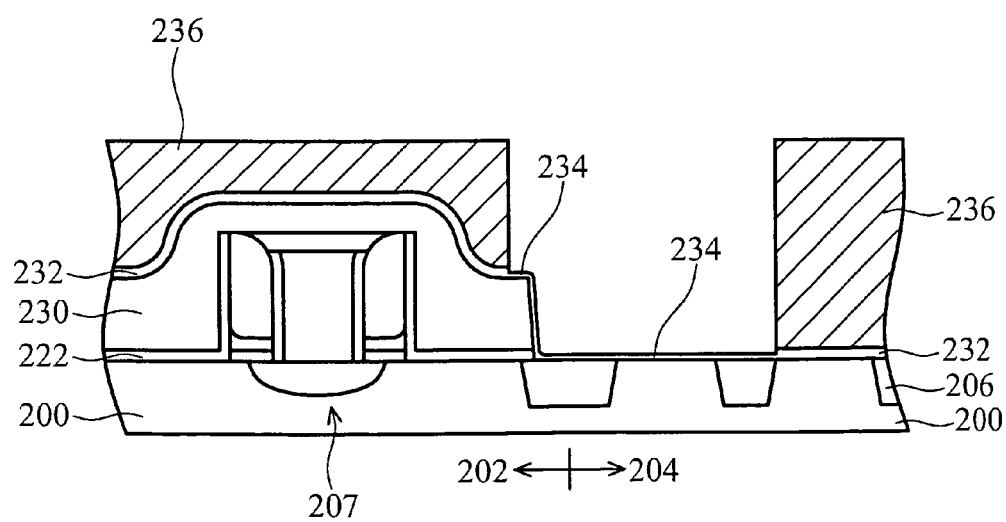

Referring to FIG. 5, a process for defining an insulating layer with various thicknesses in the logic area 204 is then performed. In order to simplify the illustration, an insulating layer with only two thicknesses is illustrated here. For example, by performing at least one photolithography procedure, a second photoresist layer 236 is formed on part of the third insulating layer 232. Using the second photoresist layer 236 as a mask, the third insulating layer 232 is then partially etched back to define the gate insulating layers of high and low voltage MOS devices by, for example, wet etching. Thus, a thick insulating layer 232 and a thin insulating layer 234 (also referred to as a fourth insulating layer) are formed in the logic area 204. The thick insulating layer 232 can serve as the gate insulating layer of a high voltage MOS device and the thin insulating layer 234 can serve as the gate insulating layer of a low voltage MOS device. It is important to note that, the second photoresist layer 236 covers part of the memory area 202 but exposes the third insulating layer 232 at an edge of the memory area 202. The second photoresist layer 236 also covers part of the logic area 204.

During the previous step, the third insulating layer 232 at the edge of the memory area 202 is simultaneously etched back to form the fourth insulating layer 234 (i.e. the thin insulating layer), as shown as FIG. 5. The thickness of the fourth insulating layer 234 is less than 80 Å, for example, about 30 to 60 Å. Nevertheless, the thickness of the third insulating layer 232 is greater than 190 Å. That is, the thickness of the fourth insulating layer 234 is less than that of the third insulating layer 232. Accordingly, the gate insulating layers 232/234 having various thicknesses are formed on the substrate 200 in the logic circuit area 204 and the fourth insulating layer 234 (the thin insulating layer) is also formed on the first polysilicon layer 230 at the edge of the memory area 202. Next, the second photoresist layer 236 is stripped.

Figure 6:
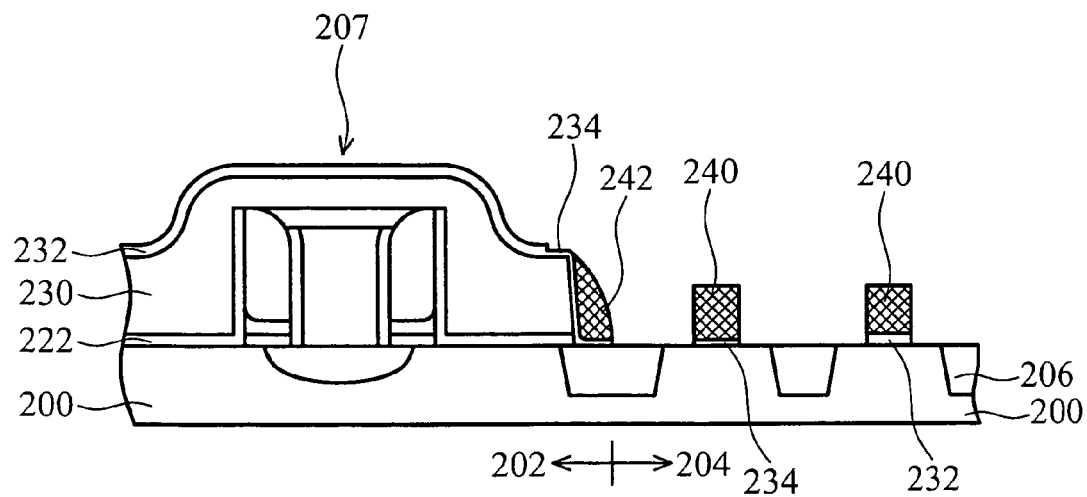

In FIG. 6, a second polysilicon layer (not shown) is blanketly formed on the third insulating layer 232 and the fourth insulating layer 234. The second polysilicon layer (not shown) can be a doped polysilicon layer. Part of the second polysilicon layer (not shown) is removed by anisotropic etching (e.g. dry etching) to define a gate 240 on the third and the fourth insulating layers 232 and 234 in the logic circuit area 204. At the same time, the anisotropic etching process (or the MOS gate process) leaves a polysilicon residue 242 overlying the sidewall of the first polysilicon layer 230.

Figure 7:
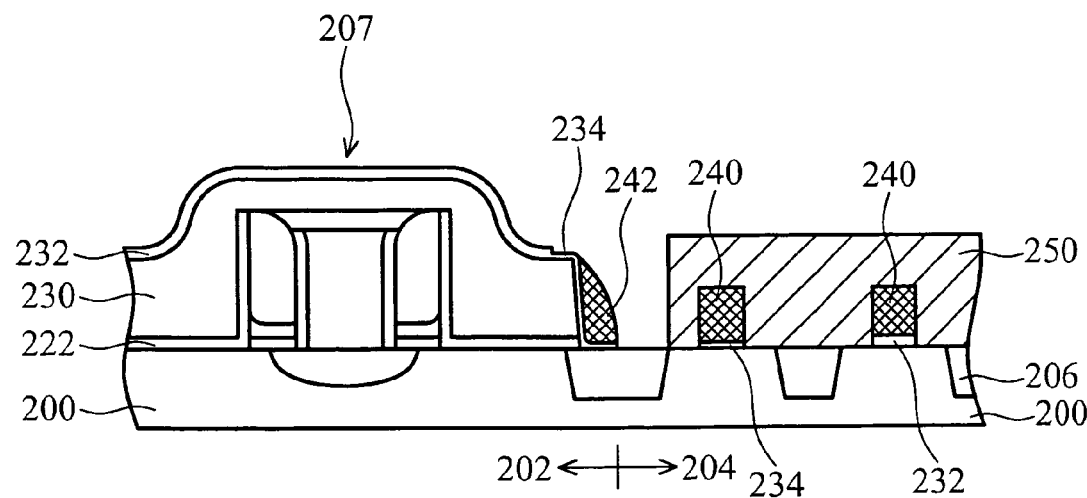

In FIG. 7, a third photoresist layer 250 is then formed over the substrate 200 in the logic circuit area 204.

Figure 8:
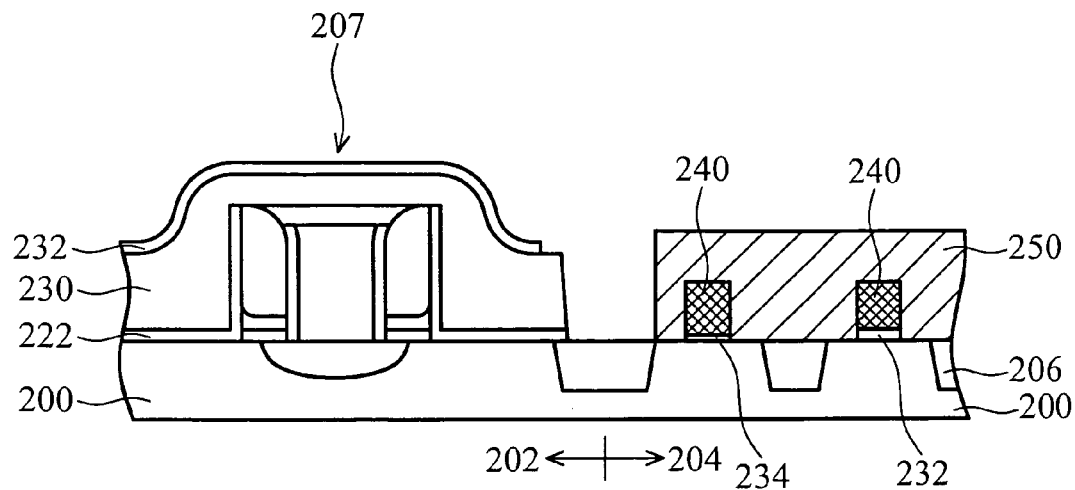

In FIG. 8, using the third photoresist layer 250 as a mask, the polysilicon residue 242 and the fourth insulating layer 234 are removed to expose the surface of the first polysilicon layer 230 at the edge of the memory area 202. The removal method is an isotropic etching, such as isotropic dry etching. During this step, the third insulating layer 232 in the memory area 202 is also partially etched back so that the thickness thereof is reduced to about 100 Å (greater than 90 Å).

Figure 9:
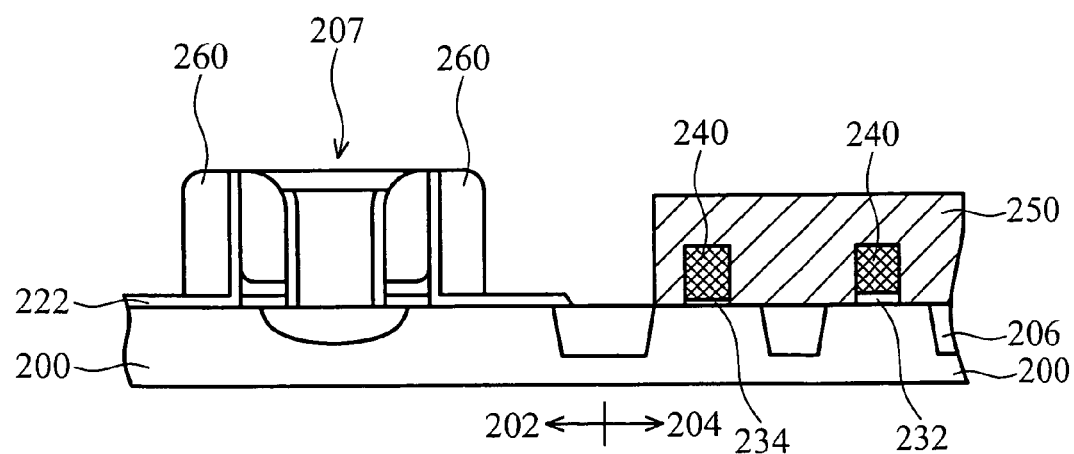

In FIG. 9, using the third photoresist layer 250 as a mask, the third insulating layer 232 and part of the first polysilicon layer 230 are removed by anisotropic etching (e.g. dry etching) to form a control gate 260 over lying the sidewall of the insulating spacer 214.

Figure 1A:
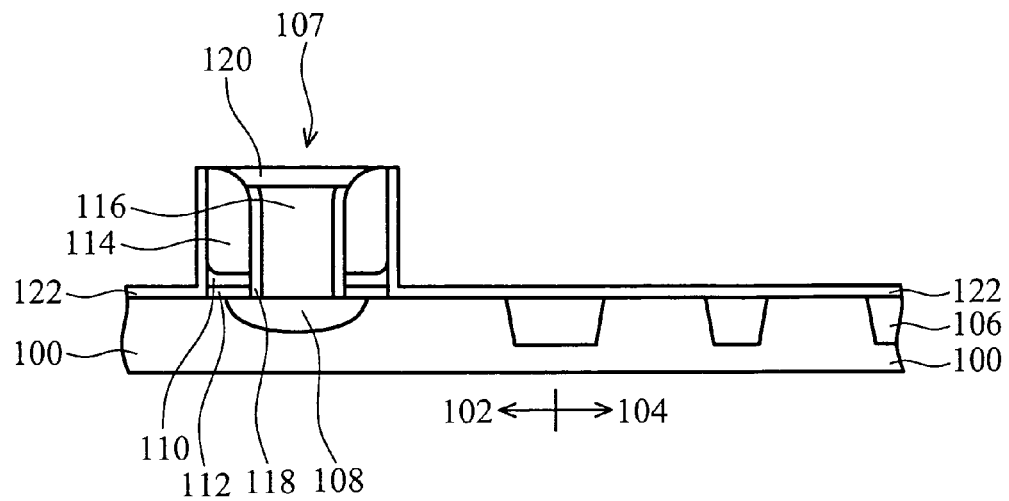
FIGS. 1A~1J are sectional views of a portion of a semiconductor substrate, schematically illustrating a conventional fabrication process for forming an embedded flash memory device.
Figure 1B:
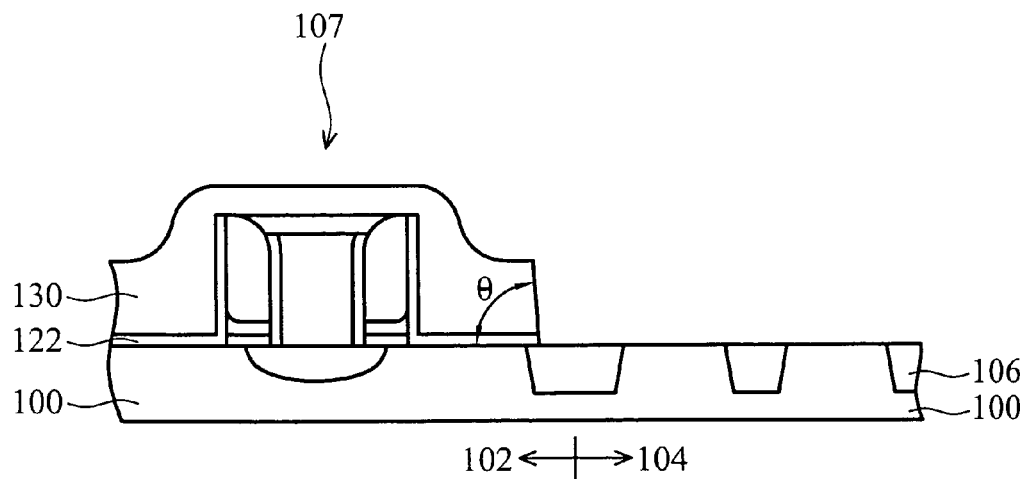
Figure 1C:
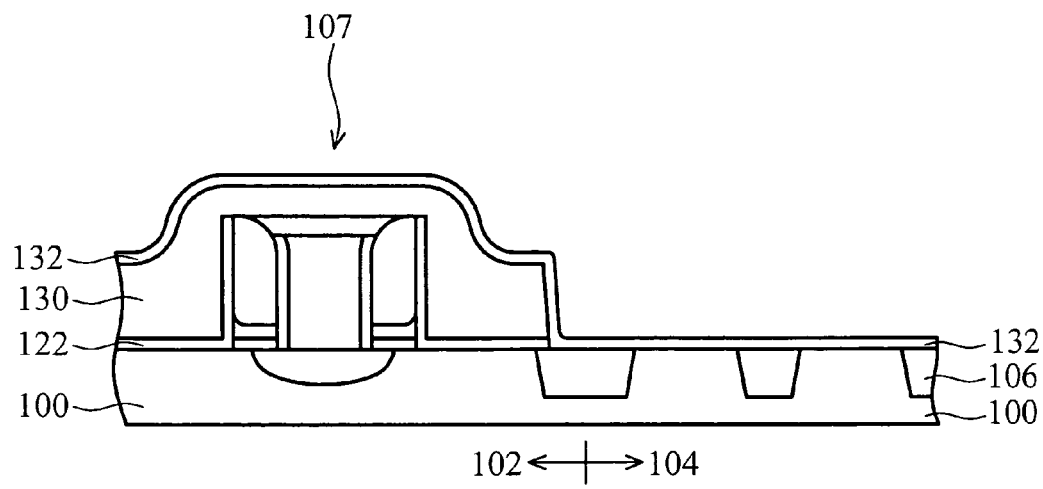
Figure 1D:
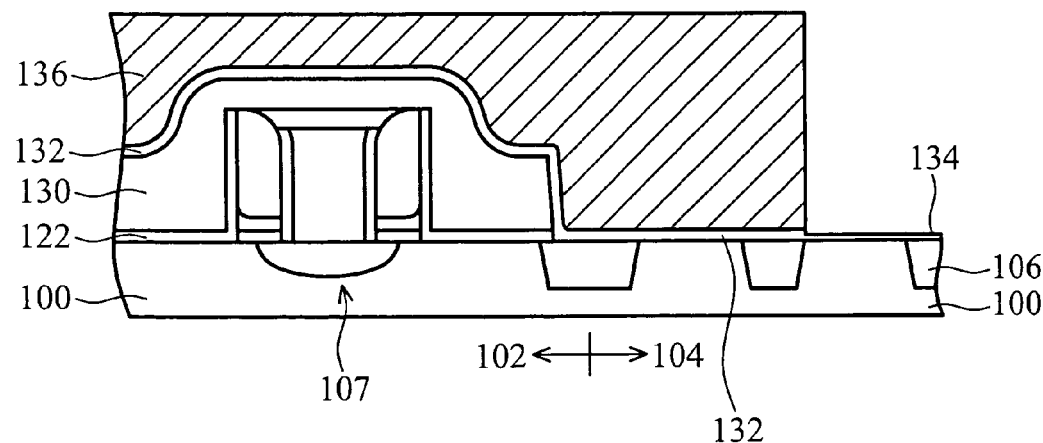
Figure 1E:
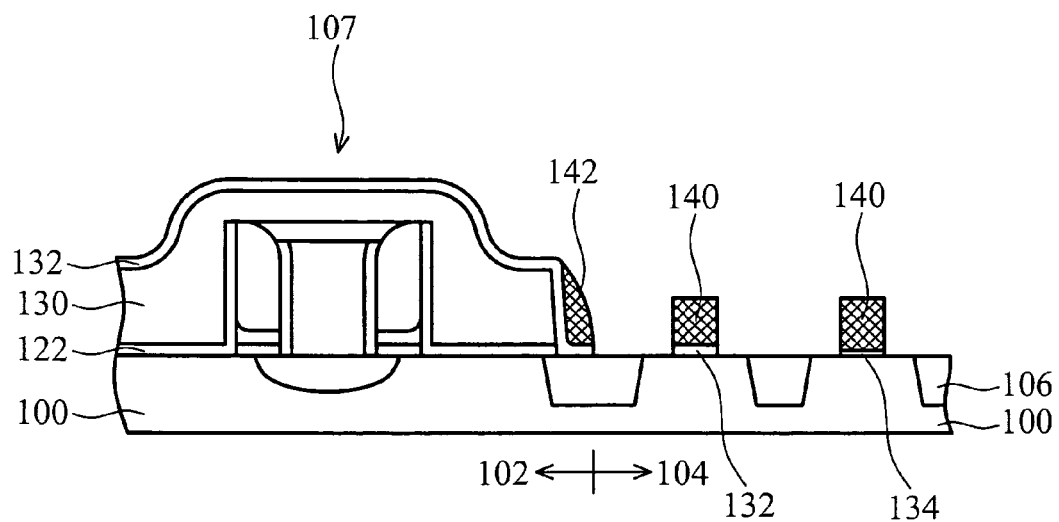
Figure 1F:
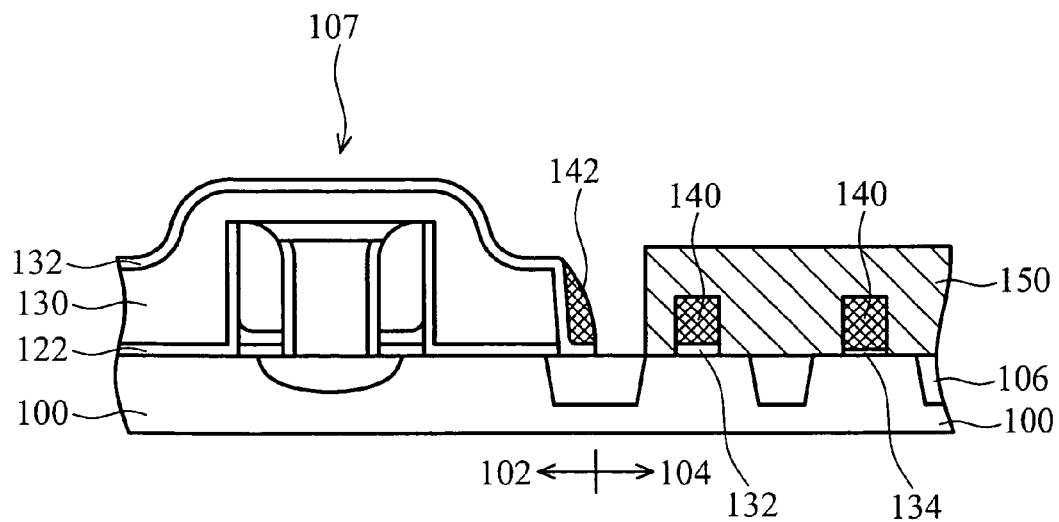
Figure 1G:
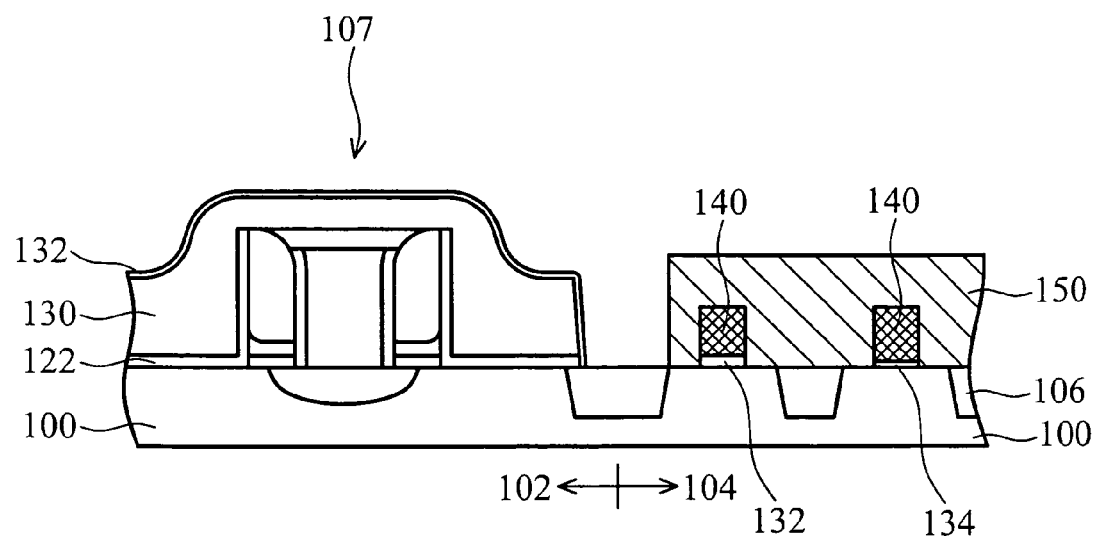

Accordingly, referring to FIG. 8, the present method does not leave an insulating layer on the surface of the first polysilicon layer 230 at the edge of the memory area 202. Thus, no polysilicon residue exists on the isolation structure 206 after anisotropic etching (or the control gate process, referring to FIG. 9), unlike the conventional process (steps shown in FIG. 1G to 1I). That is, the present method can remove the unwanted polysilicon residue at the edge of the memory area 202 without additional photolithography steps.

Figure 10:
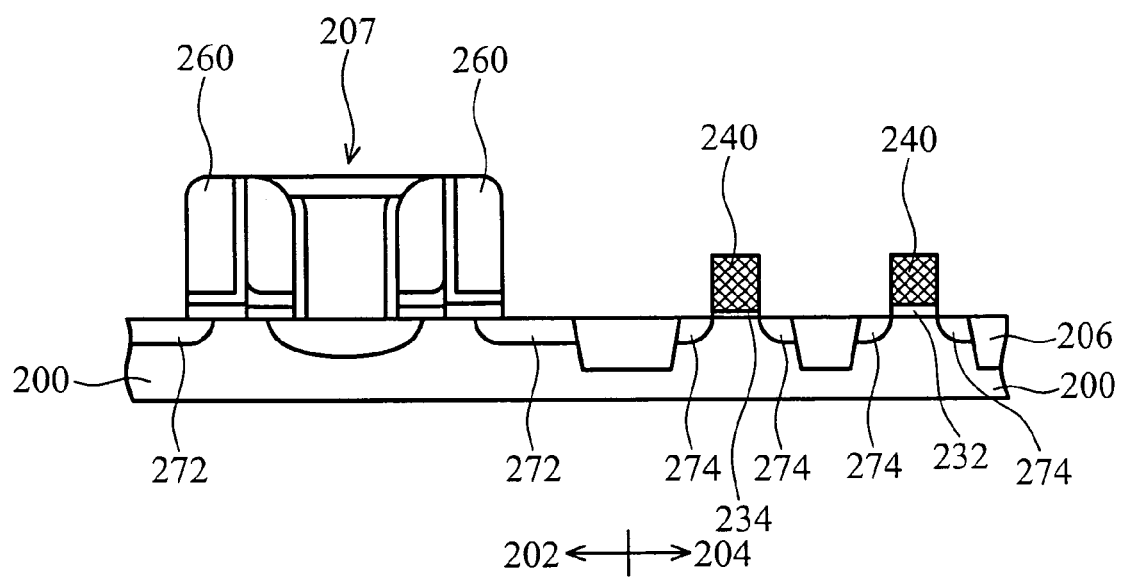

Next, the third photoresist layer 250 is removed, as shown as in FIG. 10.

In FIG. 10, the insulating layer 222 adjacent to the control gate 260 is removed. Doped regions 272 and 274 are then formed in part of the substrate 200 by ion implantation. Thus, a flash memory cell in the memory area 202 and MOS structures in logic area 204 are obtained. The doped region 272 serves as a drain region of the flash memory cell. The doped region 274 serves as a MOS source/drain region.

Figure 1H:
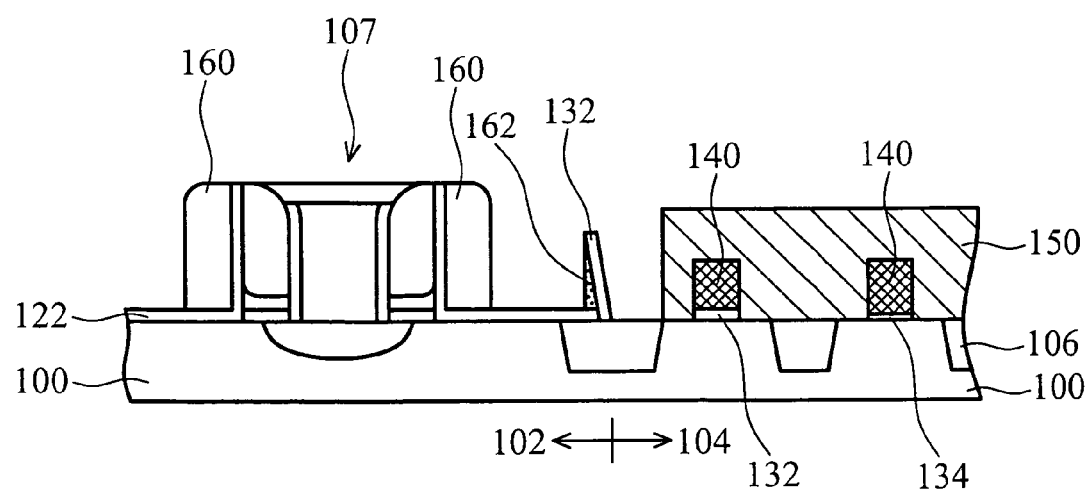
Figure 1I:
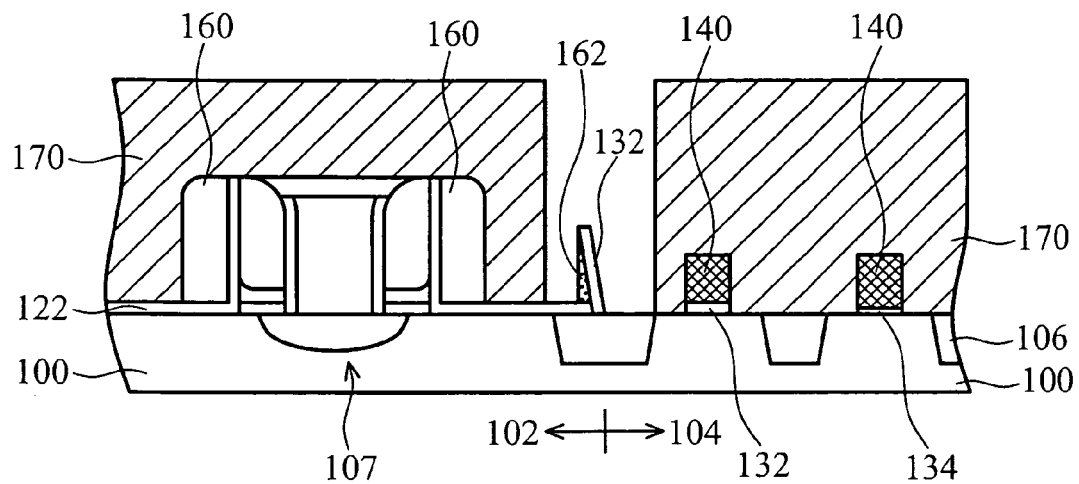
Figure 1J:
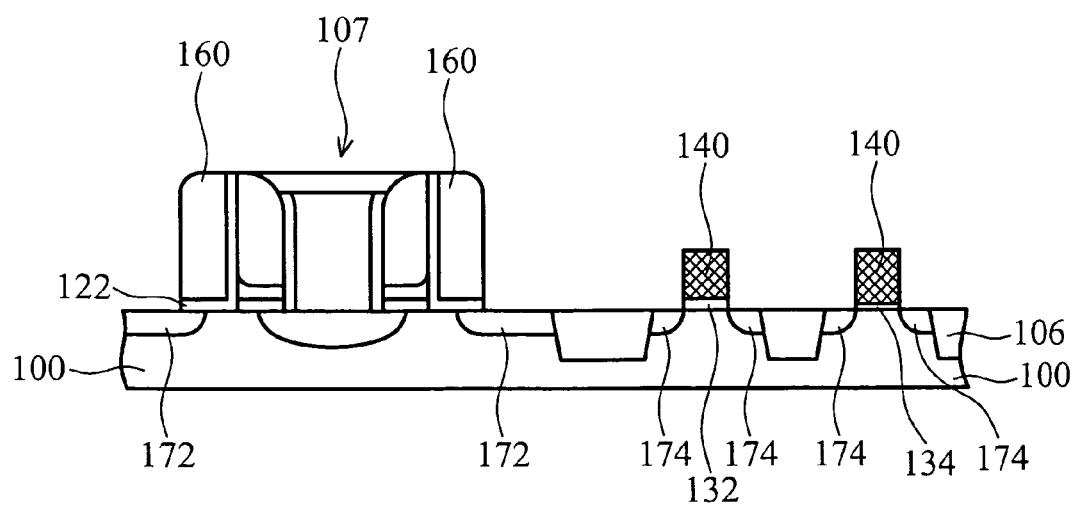

Thus, the present invention provides a novel method of forming an embedded flash memory device, which can eliminate the polysilicon residue (162, as shown in FIG. 1H) caused by the control gate process without additional steps. The present method is characterized in that the thick insulating layer (232) at the edge of the memory area (202) is partially etched back to form a thin insulating layer (234) therein. The polysilicon residue (242), caused by the MOS gate process, and the thin insulating layer (234) are removed to expose the surface of the first polysilicon layer (230) at the edge of the memory area (202). Thus, polysilicon residue (162, as shown in FIG. 1H) caused by the conventional control gate process does not occur, thereby simplifying the conventional process, reducing manufacturing cost and ameliorating the other disadvantages of the prior art.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation to encompass all such modifications and similar arrangements.

What is claimed is:

1. A method of fabricating an embedded flash memory device, comprising the steps of:
   providing a substrate having a memory area, wherein a device is formed on the substrate in the memory area;
   forming a conductive layer over the substrate to cover the device in the memory area;
   forming a conformal first insulating layer on the conductive layer and the substrate;
   partially etching back the first insulating layer at an edge of the memory area to form a second insulating layer therein, wherein a thickness of the second insulating layer is less than that of the first insulating layer;
   removing the second insulating layer to expose a surface of the conductive layer at an edge of the memory area; and
   removing the first insulating layer and part of the conductive layer so as to define a control gate on the sidewall of the device.

2. The method according to claim 1, wherein the conductive layer is a polysilicon layer.

3. The method according to claim 1, wherein the insulating layer is a $SiO_2$ layer.

4. The method according to claim 1, wherein the substrate further comprises a logic circuit area.

5. A method of fabricating an embedded flash memory device, comprising the steps of:
   providing a substrate having a memory area and a logic circuit area, wherein a first device is formed on the substrate in the memory area;
   forming a conductive layer over the substrate to cover the first device in the memory area;
   forming a conformal first insulating layer on the conductive layer and the substrate;
   partially etching back the first insulating layer at an edge of the memory area to form a second insulating layer therein, wherein a thickness of the second insulating layer is less than that of the first insulating layer;
   performing a semiconductor process to form a second device on the substrate in the logic circuit area, wherein the semiconductor process generates a polysilicon residue overlying a sidewall of the conductive layer;
   forming a mask layer over the substrate to cover the second device in the logic circuit area;
   removing the polysilicon residue and the second insulating layer to expose a surface of the conductive layer at the edge of the memory area; and
   using anisotropic etching to remove the first insulating layer and part of the conductive layer to define a control gate on the sidewall of the first device.

6. The method according to claim 5, wherein the conductive layer is a polysilicon layer.

7. The method according to claim 5, wherein the first insulating layer is a $SiO_2$ layer.

8. The method according to claim 5, wherein the second insulating layer is a $SiO_2$ layer.

9. The method according to claim 5, wherein the semiconductor process comprises a polysilicon gate process, used to define a gate on the first insulating layer in the logic circuit area and generate the polysilicon residue on the sidewall of the conductive layer.

10. The method according to claim 5, wherein the mask is a photoresist layer.

11. The method according to claim 5, further comprising the steps of:
    removing the mask layer; and
    using the first device, the control gate and the second device as masks, and performing an ion implantation procedure to form a first doped region in the substrate beside the control gate and a second doped region in the substrate beside the second device.

12. The method according to claim 11, wherein the mask is a photoresist layer.

13. The method according to claim 5, wherein the method of forming the first device comprises the steps of:
    forming a source region in part of the substrate;
    forming a floating gate above part of the substrate, wherein the floating gate is insulated from the substrate;
    forming an insulating spacer on the floating gate; and
    forming a conformal dielectric layer on the sidewalls of the insulating spacer and the floating gate and on the substrate.

14. A method of fabricating an embedded flash memory device, comprising the steps of:
    (a) providing a substrate having a memory area and a logic circuit area, wherein a first device is formed on the substrate in the memory area, and the formation of the first device comprises the steps of:

sequentially forming a first insulating layer and a conductive layer on the substrate;

forming a buffer layer on part of the conductive layer, wherein the buffer layer has a first opening exposing the conductive layer;

forming an insulating spacer on the sidewall of the first opening to cover part of the conductive layer;

using the insulating spacer as a mask, removing the conductive layer and the first insulating layer beneath the first opening to expose the substrate;

forming a dielectric layer on the sidewall of the first opening;

forming a first doped region in the substrate in the first opening;

forming a conductive plug in the first opening to electrically connect the first doped region;

forming an oxide layer on a top surface of the conductive plug;

using the oxide layer and the insulating spacer as masks, removing the buffer layer and part of the conductive layer to define a floating gate and a second opening; and forming a conformal second insulating layer on a surface of the second opening;

(b) forming a conformal first polysilicon layer on the second insulating layer to cover the first device;

(c) forming a first photoresist layer to cover the memory area;

(d) using the first photoresist layer as a mask, removing the first polysilicon layer and the second insulating layer in the logic circuit area;

(e) removing the first photoresist layer;

(f) forming a conformal third insulating layer on the first polysilicon layer and the substrate;

(g) forming a second photoresist layer on part of the third insulating layer but exposing the third insulating layer at an edge of the memory area;

(h) using the second photoresist layer as a mask, partially etching back the third insulating layer to form a fourth insulating layer, wherein a thickness of the fourth insulating layer is less than that of the third insulating layer, and the third insulating layer and the fourth insulating layer are thus formed on the substrate in the logic circuit area and the fourth insulating layer is formed on the first polysilicon layer at the edge of the memory area;

(i) removing the second photoresist layer;

(j) forming a second polysilicon layer on the third insulating layer and the fourth insulating layer;

(k) anisotropically etching back part of the second polysilicon layer to define a gate on the third and the fourth insulating layers in the logic circuit area and generate a polysilicon residue overlying a sidewall of the first polysilicon layer;

(l) forming a third photoresist layer over the substrate in the logic circuit area;

(m) using the third photoresist layer as a mask, removing the polysilicon residue and the fourth insulating layer to expose a surface of the first polysilicon layer at the edge of the memory area;

(n) using anisotropic etching to remove the third insulating layer and part of the first polysilicon layer so as to define a control gate overlying a sidewall of the insulating spacer; and (o) removing the third photoresist layer.

15. The method according to claim 14, further comprising the steps of:

forming a first doped region in the substrate adjacent to the control gate; and forming a second doped region in the substrate adjacent to the gate.

16. The method according to claim 14, wherein the first insulating layer is a $SiO_2$ layer.

17. The method according to claim 14, wherein the conductive layer is a polysilicon layer.

18. The method according to claim 14, wherein the buffer layer is a SiN layer.

19. The method according to claim 14, wherein the insulating spacer is a TEOS-$SiO_2$ layer.

20. T The method according to claim 14, wherein the dielectric layer is an ONO layer.

21. The method according to claim 14, wherein the conductive plug is a polysilicon layer.

22. The method according to claim 14, wherein the second insulating layer is a $SiO_2$ layer.

23. The method according to claim 14, wherein the third insulating layer is a $SiO_2$ layer.

24. The method according to claim 14, wherein the fourth insulating layer is a $SiO_2$ layer.

25. The method according to claim 14, in step (h), wherein a thickness of the third insulating layer is greater than 190 Å, and a thickness of the fourth insulating layer is less than 80 Å.

26. The method according to claim 14, after performing step (m), wherein a thickness of the third insulating layer is greater than 90 Å.

* * * * *